(12) United States Patent
Valad Beigi et al.

(10) Patent No.: US 11,507,641 B2
(45) Date of Patent: Nov. 22, 2022

(54) TEMPERATURE-BASED ADJUSTMENTS FOR IN-MEMORY MATRIX MULTIPLICATION

(71) Applicant: Advanced Micro Devices, Inc., Santa Clara, CA (US)

(72) Inventors: Majed Valad Beigi, Santa Clara, CA (US); Amin Farmahini-Farahani, Santa Clara, CA (US); Sudhanva Gurumurthi, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 718 days.

(21) Appl. No.: 16/428,903

(22) Filed: May 31, 2019

(65) Prior Publication Data

US 2020/0380063 A1 Dec. 3, 2020

(51) Int. Cl.
*G06F 17/16* (2006.01)
*G01K 3/14* (2006.01)
*G01K 3/10* (2006.01)

(52) U.S. Cl.
CPC .............. *G06F 17/16* (2013.01); *G01K 3/10* (2013.01); *G01K 3/14* (2013.01)

(58) Field of Classification Search
CPC . G06F 17/17; G01K 3/14; G01K 3/11; G01K 13/00; G06N 3/0635
USPC ......................................................... 708/607
See application file for complete search history.

(56) References Cited

U.S. PATENT DOCUMENTS

| | | | |
|---|---|---|---|
| 10,755,783 B2 * | 8/2020 | Tran | G11C 16/0425 |
| 2013/0003438 A1 | 1/2013 | Merkel et al. | |
| 2018/0108403 A1 | 4/2018 | Ge et al. | |
| 2019/0122727 A1 | 4/2019 | Le Gallo-Bourdeau et al. | |

FOREIGN PATENT DOCUMENTS

CN 108830840 A 11/2018

OTHER PUBLICATIONS

Mittal, S. "A Survey of ReRam-Based Architectures for Processing-In-Memory and Neural Networks", Machine Learning and Knowledge Extraction, vol. 1, Issue 5, 40 pages, Apr. 2018.
(Continued)

*Primary Examiner* — Tan V Mai
(74) *Attorney, Agent, or Firm* — Volpe Koenig

(57) ABSTRACT

Techniques for performing in-memory matrix multiplication, taking into account temperature variations in the memory, are disclosed. In one example, the matrix multiplication memory uses ohmic multiplication and current summing to perform the dot products involved in matrix multiplication. One downside to this analog form of multiplication is that temperature affects the accuracy of the results. Thus techniques are provided herein to compensate for the effects of temperature increases on the accuracy of in-memory matrix multiplications. According to the techniques, portions of input matrices are classified as effective or ineffective. Effective portions are mapped to low temperature regions of the in-memory matrix multiplier and ineffective portions are mapped to high temperature regions of the in-memory matrix multiplier. The matrix multiplication is then performed.

20 Claims, 5 Drawing Sheets

(56) References Cited

OTHER PUBLICATIONS

Valad Beigi, M. and Memik, G. "Thermal-aware Optimizations of reRAM-based Neuromorphic Computing Systems", Proceedings of the 55th Annual Design Automation Conference, Article No. 39, ACM, New York, NY, Jun. 2018.

Tsai, H., et al. "Recent Progress in Analog Memory-Based Accelerators for Deep Learning" Journal of Physics D: Applied Physics vol. 51, Issue 28, 27 pgs., Jun. 2018.

Walczyk, C., et al. "Impact of Temperature on the Resistive Switching Behavior of Embedded HfO2-Based RRAM Devices", IEEE Transactions on Electron Devices, vol. 58, Issue 9, pp. 3124-3131, Sep. 2011.

Chen, L., et al. "Accelerator-Friendly Neural-Network Traning: Learning Variations and Defects in RRAM Crossbar", Design, Automation & Test in Europe Conference and Exhibition, 6 pgs., Switzerland, Mar. 2017.

Liu, C., et al. "Rescuing Memristor-based Neuromorphic Design with High Defects", 2017 54th Annual Design Automation Conference, 6 pgs., Jun. 2017.

Liu, B., et al. "Vortex: Variation-Aware Training for Memristor X-Bar", 2015 52nd ACM/EDAC/IEEE Design Automation Conference, 6 pgs., Jun. 2015.

Zhang, W. and Li, T. "Helmet: A Resistance Drift Resilient Architecture for Multi-Level Cell Phase Change Memory System", 2011 IEEE/IFIP 41st International Conference on Dependable Systems & Networks, Jun. 2011.

Zhang, W. and Li, T. "Exploring Phase Change Memory and 3D Die-Stacking for Power/Thermal Friendly, Fast and Durable Memory Architectures", 18th International Conference on Parallel Architectures and Compilation Techniques, 12 pgs., Sep. 2009.

Schechter, S., et al. "Use ECP, not ECC, for Hard Failures in Resistive Memories", Proceedings of the 37th Annual International Symposium on Computer Architecture, pp. 141-152, ACM, New York, NY, Jun. 2010.

Hyun Yoon, D., et al. "FREE-p: Protecting Non-Volatile Memory Against Both Hard and Soft Errors", 17th International Symposium on High-Performance Computer Architecture, San Antonio, TX, USA, Feb. 2011.

Valad Beigi, M. and Memik, G. "TESLA: Using Microfluidics to Thermally Stabilize 3D Stacked STT-RAM Caches", IEEE 34th International Conference on Computer Design, 4 pgs., Oct. 2016.

\* cited by examiner

TEMPERATURE-BASED ADJUSTMENTS FOR IN-MEMORY MATRIX MULTIPLICATION

BACKGROUND

Matrix multiplication is a type of calculation frequently used in many types of computing tasks, such as three-dimensional graphics rendering and performing calculations for artificial neural networks. Thus improvements to the performance of matrix multiplications are constantly being made.

BRIEF DESCRIPTION OF THE DRAWINGS

A more detailed understanding can be had from the following description, given by way of example in conjunction with the accompanying drawings wherein.

DETAILED DESCRIPTION

Techniques for performing in-memory matrix multiplication, taking into account temperature variations in the memory, are disclosed. In one example, the matrix multiplication memory uses ohmic multiplication and current summing to perform the dot products involved in matrix multiplication. One downside to this analog form of multiplication is that temperature affects the accuracy of the results. Thus techniques are provided herein to compensate for the effects of temperature increases on the accuracy of in-memory matrix multiplications.

According to the techniques, regions of a matrix multiplication memory are classified as high or low temperature based on measurements from temperature sensors. In one example, the regions span the matrix memory die and are parallel to the wordlines of the memory circuitry. Two peripheral regions (e.g., "top" and "bottom" regions) have corner or peripheral sensors, and both peripheral and non-peripheral regions have central temperature sensors. A temperature controller determines estimated temperatures for these regions based on the readings from the temperature sensors and classifies the regions as either hot or cold based on a comparison of the estimated temperatures to a threshold value. The temperature controller classifies portions (such as rows or columns) of an input matrix (a matrix multiplicand) as either "effective" or "ineffective" based on the magnitudes of the elements of those portions. More specifically, a portion that has a number of non-zero elements that is above a threshold is considered "effective," and a portion that has a number of non-zero elements equal to or below a threshold is considered "ineffective." A "non-zero element" is an element having an absolute value that is greater than zero or greater than a value that is close to zero. Because "effective" portions have a greater impact on the resultant matrix multiplication product than "ineffective" portions, the temperature controller maps ineffective portions to the high temperature regions and maps effective portions to low temperature regions. Because increased temperature reduces the accuracy of calculations in the memory, mapping "effective" portions to low temperature regions improves the accuracy of the matrix multiplications. Additional details are provided elsewhere herein.

Figure 1:
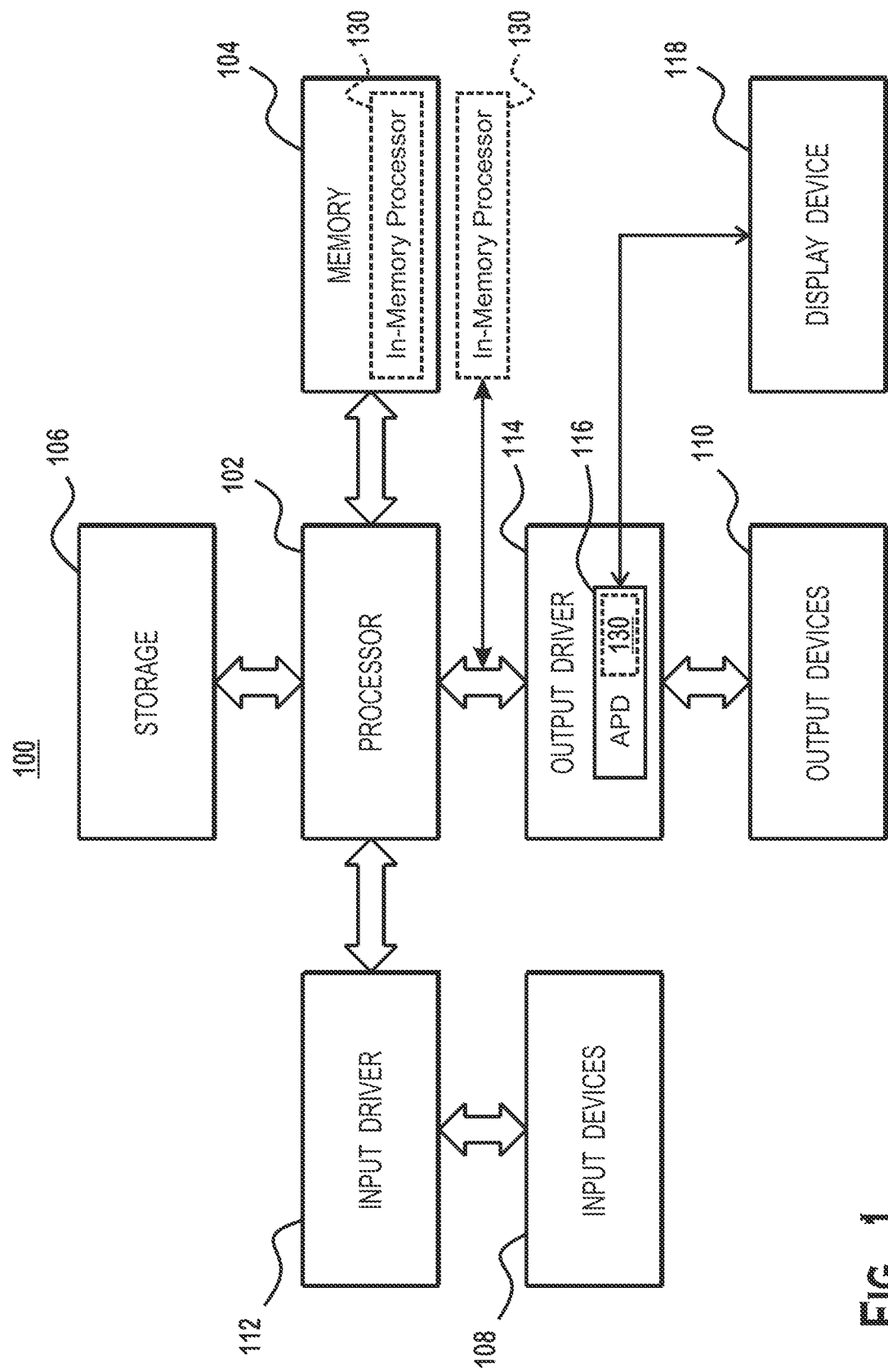
FIG. 1 is a block diagram of an example computing device in which one or more features of the disclosure can be implemented.

FIG. 1 is a block diagram of an example computing device 100 in which one or more features of the disclosure can be implemented. The computing device 100 could be one of, but is not limited to, for example, a computer, a gaming device, a handheld device, a set-top box, a television, a mobile phone, a tablet computer, or other computing device. The computing device 100 includes one or more processors 102, a memory 104, a storage 106, one or more input devices 108, and one or more output devices 110. The computing device 100 also includes one or more input drivers 112 and one or more output drivers 114. Any of the input drivers 112 are embodied as hardware, a combination of hardware and software, or software, and serve the purpose of controlling input devices 112 (e.g., controlling operation, receiving inputs from, and providing data to input drivers 112). Similarly, any of the output drivers 114 are embodied as hardware, a combination of hardware and software, or software, and serve the purpose of controlling output devices 114 (e.g., controlling operation, receiving inputs from, and providing data to output drivers 114). It is understood that the computing device 100 can include additional components not shown in FIG. 1.

In various alternatives, the one or more processors 102 include a central processing unit (CPU), a graphics processing unit (GPU), a CPU and GPU located on the same die, or one or more processor cores, wherein each processor core can be a CPU or a GPU. In various alternatives, the memory 104 is located on the same die as one or more of the one or more processors 102, or is located separately from the one or more processors 102. The memory 104 includes a volatile or non-volatile memory, for example, random access memory (RAM), dynamic RAM, or a cache.

The storage 106 includes a fixed or removable storage, for example, without limitation, a hard disk drive, a solid state drive, an optical disk, or a flash drive. The input devices 108 include, without limitation, a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 110 include, without limitation, a display, a speaker, a printer, a haptic feedback device, one or more lights, an antenna, or a network connection (e.g., a wireless local area network card for transmission and/or reception of wireless IEEE 802 signals).

The input driver 112 and output driver 114 include one or more hardware, software, and/or firmware components that are configured to interface with and drive input devices 108 and output devices 110, respectively. The input driver 112 communicates with the one or more processors 102 and the input devices 108, and permits the one or more processors 102 to receive input from the input devices 108. The output driver 114 communicates with the one or more processors 102 and the output devices 110, and permits the one or more processors 102 to send output to the output devices 110.

In some implementations, the output driver 114 includes an accelerated processing device ("APD") 116. In some implementations, the APD 116 is used for general purpose computing and does not provide output to a display (such as display device 118). In other implementations, the APD 116 provides graphical output to a display 118 and, in some alternatives, also performs general purpose computing. In some examples, the display device 118 is a physical display device or a simulated device that uses a remote display protocol to show output. The APD 116 is configured to accept compute commands and/or graphics rendering commands from the one or more processors 102, to process those compute and/or graphics rendering commands, and, in some examples, to provide pixel output to display device 118 for display. The APD 116 includes one or more parallel processing units configured to perform computations in accordance with a single-instruction-multiple-data ("SIMD") paradigm.

The computing device 100 includes one or more in-memory processors 130. The in-memory processors perform matrix multiplications by applying input signals to values stored in memory cells and obtaining elements of the multiplication product as output. Many implementations for in-memory matrix multiplications are possible. In one implementation, the memory cells are resistive random access memory cells. To perform a multiplication in this implementation, the cells are loaded with values corresponding to the elements of the matrix. Specifically, the resistances are set to the reciprocals of the matrix elements (i.e., the conductances of the resistive elements are set to the values of the matrix elements). In some implementations, the resistances encode values that represent the matrix elements, rather than storing those values directly. A series of voltages corresponding to the values of the vector to be multiplied by the matrix is applied to a series of bitlines. Due to Ohm's Law, the dot-products of the vector with each of the matrix rows is output as the multiplication product. Although some example locations for the in-memory processors 130 are shown, it should be understood that any in-memory processor 130, located in any technically feasible location or device, falls within the scope of the present disclosure.

Figure 2:
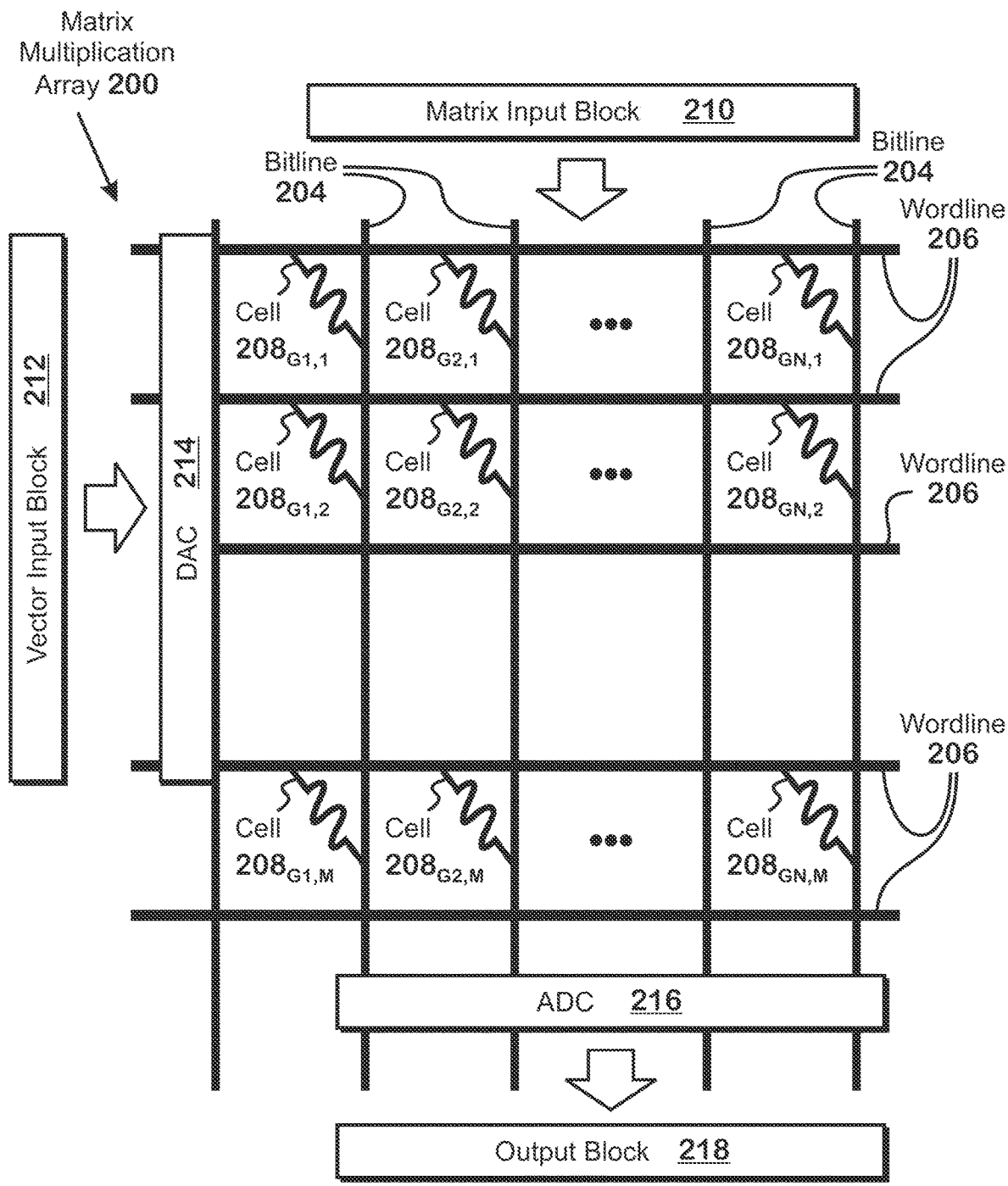
FIG. 2 is a block diagram illustrating details of a matrix multiplication array, according to an example.

FIG. 2 is a block diagram illustrating details of a matrix multiplication array 200, according to an example. The matrix multiplication array 200 is a portion of the in-memory processor 130 of FIG. 1 in an example implementation of the in-memory processor 130 using resistive random access memory ("RAM"). The matrix multiplication array 200 includes a plurality of wordlines 206 coupled to a plurality of bitlines 204 via resistive cell elements 208. The matrix multiplication array 200 also includes a matrix input block 210, a vector input block 212, a digital-to-analog converter 214 for the vector input, an analog-to-digital converter 216 for the output, and an output block 218.

Matrix multiplication of a column vector (V) by a matrix (M) occurs as follows:

$$\begin{bmatrix} V1 \\ V2 \\ V3 \end{bmatrix} \begin{bmatrix} M1,1 & M2,1 & M3,1 \\ M1,2 & M2,2 & M3,2 \\ M1,3 & M2,3 & M3,3 \end{bmatrix} = \begin{bmatrix} V1M1,1 + V2M2,1 + V3M3,1 \\ V1M1,2 + V2M2,2 + V3M3,2 \\ V1M1,3 + V2M2,3 + V3M3,3 \end{bmatrix}$$

The result of such a multiplication is a column vector whose elements are the dot products of the input vector and each of the rows of the matrix. For example, the top element of the output vector is the dot product of the vector and the top row of the matrix. The middle and bottom elements of the output vertices are, similarly, the dot products of the input vector and the middle and bottom rows of the matrix, respectively.

A matrix multiplication with the matrix multiplication array 200 occurs by setting the resistive memory cells 208 to have conductances (represented by the letter "G", where conductance is the reciprocal of resistance) equal to the elements of the matrix to be multiplied. Then voltages equal to the elements of the vector to be multiplied are applied to the wordlines. In this configuration, each wordline performs a dot product, using Ohm's Law and Kirchoffs Law. More specifically, the voltages applied on the wordlines 206 are applied to each of the resistive cells 208. This application of voltage causes a current to flow across the resistive cells 208 from the bitline 204 to the wordline 206. By Ohm's Law, the amount of current that flows is equal to VG, where "V" is the voltage applied on the bitline 204 and "G" is the conductance of the resistive cell 208. By Kirchoffs Law, the amount of current that flows on a bitline 204 to the ADC 216 is equal to the sum of the currents that flow across each of the resistive cells 208. Thus, the sum of products—a dot product—is output on each bitline 204. The dot product is the dot product of the input vector and a row of the input matrix.

In the example provided, the physical orientation of the resistive cells 208 and the input vector does not match the logical orientation of the elements of the matrix and a vector, assuming the input vector is a column vector. More specifically, as described above, the multiplication of a column vector by a matrix results in an output vector whose elements are the dot products of the input vector and each row of the matrix. However, the matrix multiplication array 200 performs dot products of the input vector and the columns of the resistive cells 208. Therefore, the elements of the matrix are loaded into the resistive cells 208 in a reverse orientation as compared with the notational representation of matrix multiplication (e.g., the columns of the resistive cells 208 are loaded with the values of the rows of the notational representation of the matrix). If the input vector is a row vector, then the orientation of the values loaded into the resistive cells 208 do match that of the notational representation of the matrix, but the values of the row input vector are laid out vertically as shown in FIG. 2.

The technique described above can be extended to perform a matrix by matrix multiplication. More specifically, each column (or row) of the product of such a multiplication is equal to the matrix multiplication of each column (or row) of a first input matrix and the second input matrix. Thus, such a multiplication is performed by repeating the technique described above for each column (or row) of a first input matrix to obtain the column (or row) of an output matrix.

The matrix input block 210 loads values into the resistive cells 208, setting the resistances of those resistive cells 208 according to the values of the matrix (e.g., as the reciprocals of those values). The vector input block 212 applies digital values associated with the input vector to be multiplied to the digital-to-analog converter 214. The digital-to-analog converter 214 converts these applied values to voltages and applies the voltages to the appropriate wordlines 206. The analog-to-digital converter 216 converts the received currents into digital signals and provides those digital signals to the output block 218. Elements that provide digital values to the vector input block 212 and receive digital values from the output block 218 are not illustrated in FIG. 2 but any technically feasible element could be used.

The various elements illustrated in FIG. 2 are implemented as appropriate circuitry arranged to perform the functions described. Note that a particular implementation of in-memory matrix multiplication, involving resistive RAM is disclosed, but this technique may be substituted with any other technically feasible technique for performing in-memory matrix multiplication in which the techniques for temperature-based adjustments disclosed herein may be applied. Any such alternative matrix multiplication implementation falls in the scope of the present disclosure.

The matrix multiplication technique described herein is an analog process. Thus, the results of the matrix multiplication are dependent on physical aspects of the matrix multiplication array 200. One such physical aspect is temperature, which can vary across a die that includes many instances of the matrix multiplication array 200. For example, it is possible for elements of such a die to heat up, leading to changes in the current that flows onto the bitlines 204 (due, for example, to changes to resistances of the resistive cells 208). Techniques are therefore provided herein to reduce the effect of temperature changes on the results output from matrix multiplication arrays 200.

Note that the techniques described with respect to FIG. 2 may be used to perform matrix multiplication for any portion of the present disclosure that states that an in-memory matrix multiplication is performed.

Figure 3:
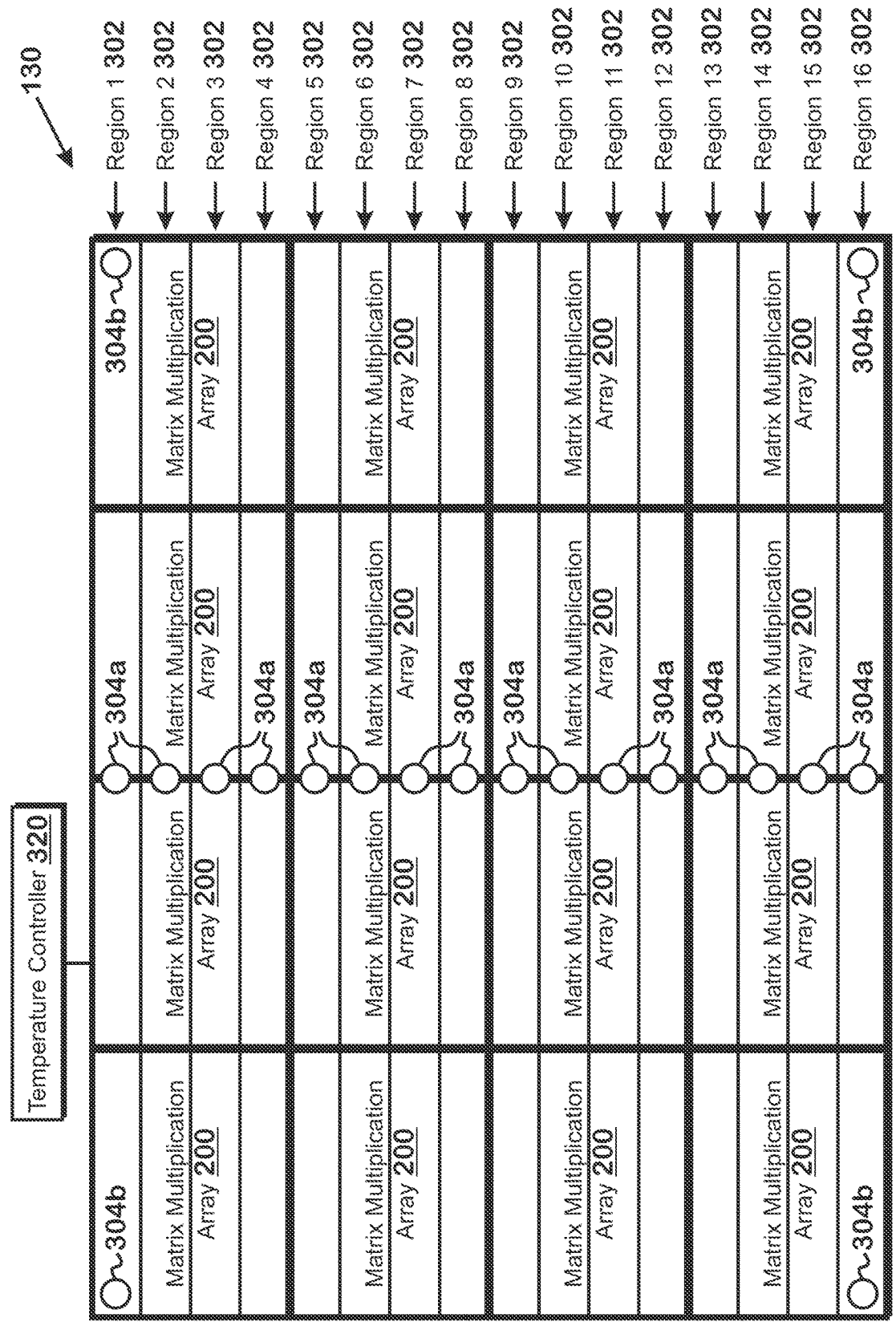
FIG. 3 is an illustration showing details of the in-memory processor of FIG. 1 including the temperature controller, according to an example.

FIG. 3 is an illustration showing details of the in-memory processor 130 of FIG. 1, according to an example. The in-memory processor 130 includes a plurality of matrix multiplication arrays 200 and a temperature controller 320. The in-memory processor 130 also includes a plurality of temperature sensors 304. The temperature sensors 304 include central sensors 304a and peripheral sensors 304b. The sensors 304 measure temperature at the locations of the sensors 304. The temperature controller 320 receives those temperature measurements and controls the matrix multiplication arrays 200 based on the temperature measurements, to mitigate the effect of temperature deviations on calculation accuracy. More specifically, the temperature controller 320 determines temperatures for the different regions 302 of the in-memory processor 130 based on the measurements from the sensors 304. Each region covers one or more rows (e.g., wordlines 206) of each of the matrix multiplication array 200. Thus, in determining the temperature for a region 302, the temperature controller 320 is determining the temperature for one or more rows of the matrix multiplication array 200.

The temperature controller 320 may use any technically feasible technique for determining a temperature for a region 302. In one example technique, the temperature controller 320 measures the temperature at each central temperature sensor 304a and each peripheral sensor 304b. The peripheral sensors 304b are in the top-most and bottom-most regions 302. For the peripheral regions (top-most and bottom-most regions), the temperature controller 320 determines the maximum temperature value of all sensors 304 in that region and uses that maximum temperature as the temperature of the peripheral region 302. For non-peripheral regions, the temperature controller 320 determines which region, of the two peripheral regions, the non-peripheral region whose temperature is being determined is closer to. The peripheral region that is closer to the region whose temperature is being determined is called the closer peripheral region.

The temperature controller 320 determines the temperature of the non-peripheral regions as follows. The temperature controller 320 determines whether the temperature of the peripheral sensors 304b in the closer peripheral region is greater than the temperature of the central sensor 304a in the non-peripheral region 302. If the temperature of the central sensor 302a in the non-peripheral region is greater than the temperatures of the peripheral sensors 304b in the closer peripheral region, then the temperature controller 320 assigns, as the temperature of the non-peripheral region, the temperature of the central sensor 304a in the non-peripheral region 302.

If the temperature of at least one peripheral sensor 304b in the peripheral region is greater than the temperature of the central sensor 304a in the peripheral region, then the temperature controller 320 determines the temperature of the non-peripheral region as the temperature of the central sensor 304a in the non-peripheral region modified based on one or more temperatures measured from the sensors 304 of the peripheral region. In one example, the temperature controller 320 determines the temperature of the non-peripheral region based on the following expression:

$$T_{ci}+2*(T_{pp}-T_{cp})$$

Where:
$T_{ci}$ is the temperature of the center sensor 304a of the non-peripheral region;
$T_{cp}$ is the temperature of the center sensor 304a in the peripheral region; and
$T_{pp}$ is the temperature of the peripheral sensor 304b with the higher temperature in the peripheral region.

In other words, the difference between the higher peripheral sensor and the center sensor in the peripheral region is doubled and the result is added to the temperature of the central sensor 304a of the non-peripheral region.

Although the above techniques are provided as examples for determining the temperatures of the regions, any technically feasible technique for determining the temperatures based on the measurements of the sensors 304 may be used. Further, although a specific expression for determining the temperature of the non-peripheral region based on the measurements of the sensors 304 in the peripheral region is provided, any technically feasible technique for determining that temperature is possible. In an example, instead of doubling the difference between the center and peripheral sensors in the peripheral region and adding that doubled difference to the temperature measured in the central sensor 304a in the non-peripheral region, the difference could be added without the doubling. The difference could also be modified by another multiplicative or additive factor, or could be modified in any other manner. In other examples, quantities that are not based on the difference between the temperatures of the central and peripheral sensors 304 in the peripheral region (but are instead based on some other quantity involving the peripheral and central sensors in the peripheral region) are used. In addition, although a specific configuration of sensors 304 is shown and described, any technically feasible arrangement of temperature sensors 304 may be used to determine the temperatures of the regions 302.

To mitigate the effect of temperature on calculation accuracy, the temperature controller 320 assigns portions (such as columns or rows, depending on how the matrix multiplication maps to the matrix multiplication array 200) of an input matrix to the wordlines 206 of a matrix multiplication array 200 based on an "effectiveness classification" of the column.

An "effectiveness classification" identifies how much impact a particular matrix portion of the input matrix has on the matrix multiplication product. In one example, a matrix portion is considered effective if the number of non-zero elements of that matrix portion is above a threshold. In some implementations, an element is considered to be non-zero if the element is not equal to zero. In other implementations, an element is considered to be non-zero if the absolute value of the element is above a threshold that is close to zero. The threshold may be selected in any technically feasible manner. A matrix portion that is not considered effective is considered ineffective. In one example, to determine the threshold value, the following is performed. The arithmetic mean of all counter values is computed (each counter stores the number of non-zero elements of each matrix portion) and referred to as the overall average (τ(avg)). τ(low_counter) is computed as the arithmetic mean of the counter values smaller than the overall average. τ(high_counter) is computed as the arithmetic mean of the counter values larger than the overall average. The counter threshold value is set to τ(high_counter) to select the most effective matrix portions in some implementations. However, other ways to select the threshold value are possible. Specifically, the distribution of the effective and ineffective matrix portions is likely to impact the optimal threshold level.

Portions of the matrix that are considered ineffective have many elements that are zero or close to zero and thus contribute relatively little to the matrix multiplication product. Thus the accuracy of ineffective matrix portions matters less than the accuracy of matrix portions considered effective. Due to this fact, within a single matrix multiplication array 200, the temperature controller 320 swaps matrix portions of the input matrix that are effective and located in high temperature regions 302 with matrix portions of the input matrix that are ineffective and located in low temperature regions 302. The temperature controller 320 also swaps elements of the input vector and/or elements of the output vector depending on whether such swap is needed to make the resulting output vector correct after swapping. Regions 302 having determined temperatures below a threshold are classified as low temperature regions and regions 302 having determined temperatures above a threshold are classified as high temperature regions. The threshold may be set in any technically feasible manner.

Figure 4:
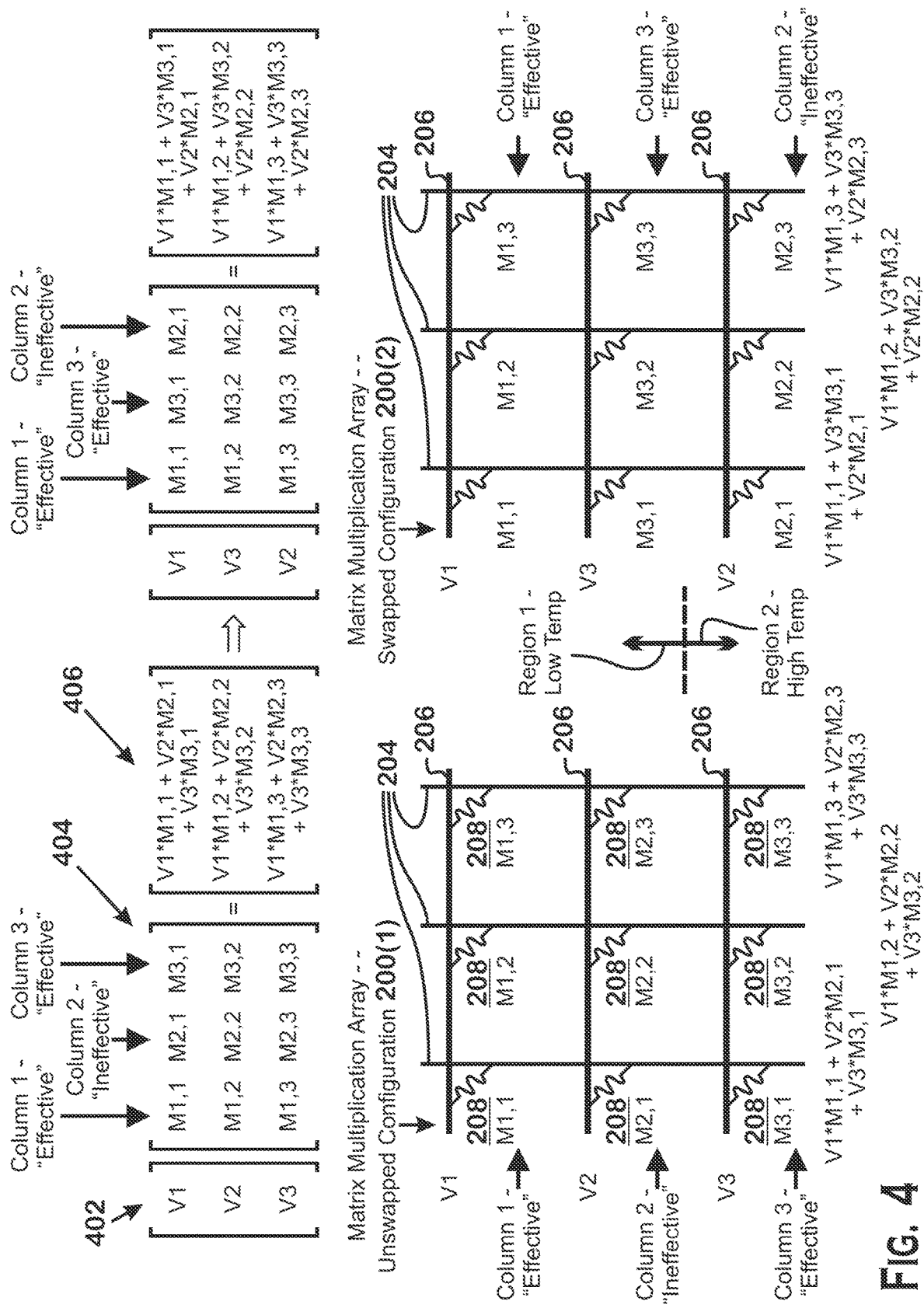
FIG. 4 illustrates an example swapping operation for a matrix multiplication.

FIG. 4 illustrates an example swapping operation for a matrix multiplication. The matrix multiplication involves multiplying column vector V 402 by matrix 404 to obtain the matrix product, output column vector 406. In this example, the columns of the input matrix are the matrix portions that are classified as effective or ineffective. The temperature controller 320 classifies the columns of the input matrix 404 as shown. Specifically, the first column and the third column are classified as effective and the second column is classified as ineffective. As described elsewhere herein, this classification is performed by classifying the elements of the columns as zero or non-zero and comparing the number of non-zero elements to a threshold. The temperature controller 320 thus arrives at the classifications shown based on the values of the columns. Specifically, the temperature controller 320 determines that the middle column includes a number of zero or near-zero values greater than a threshold and thus classifies that column as ineffective. The other two columns have a number of zero or near-zero values less than or equal to the threshold and thus the temperature controller 320 classifies those columns as ineffective.

In the matrix multiplication array in an unswapped configuration 200(1), the elements of the input vector are mapped in order as shown. Further, the elements of the matrix are mapped to the cells 208 as shown. Specifically, because the input vector is a column vector, the rows of the input matrix are mapped to the wordlines 206 of the matrix multiplication array 200, which produces the correct resulting column vector as output, as shown. This "unswapped configuration 200(1)" is a mapping that would occur without the temperature-based described herein.

The temperature controller 320, using temperature sensors 304, classifies the regions as either low temperature or high temperature according to the techniques described elsewhere herein. In FIG. 4, the top two wordlines 206 are in region 1, which is classified as low temperature, and the bottom wordline 206 is in region 2, classified as high temperature. In the unswapped configuration 200(1), an "effective" column (column 3) is assigned to a high temperature region, meaning that calculations involving column 3 will suffer from reduced accuracy.

The temperature controller 320 therefore assigns columns classified as effective to wordlines 206 in low temperature regions and assigns columns classified as ineffective to wordlines 206 in high temperature regions. In the example of FIG. 4, column 3 is swapped with column 2. Thus in the swapped configuration 200(2), the temperature controller 320 assigns column 3 to the middle wordline 206, which is in a low temperature region, and assigns column 2 to the bottom wordline 206, which is in a high temperature region. In addition, the temperature controller 320 swaps the corresponding elements of the input vector. Because columns 2 and 3 are swapped, elements 2 and 3 of the input vector are swapped. Swapping the input vector in this manner results in a correct matrix multiplication output.

Note that the example of FIG. 4 illustrates just one type of matrix multiplication and one corresponding type of swap operations, but that other types of swap operations are effective. In one example swap operation, the input is a row vector and thus the rows (rather than columns) of the input matrix are mapped to the wordlines 206, since the dot products involved in matrix multiplication happen along the columns of the matrix. In this example, rows of the input matrix (and not the columns) are classified as effective or ineffective. Rows classified as effective are mapped to wordlines 206 in low temperature regions and rows classified as ineffective are mapped to wordlines 206 in high temperature regions. Regardless of what configuration is used, the elements of the input vector may need to be swapped in order to produce a correct result. A correct result means that the elements of the input matrix and vector are multiplied and summed as would occur with matrix multiplication. In some configurations, it may be possible to swap the order of the outputs instead of, or in addition to, swapping the order of the elements of the input vector.

It is of course possible for the number of effective columns to be less than the number of low temperature wordlines 206. In that situation, the temperature controller 320 maps one or more ineffective columns to one or more low temperature wordlines 206, in addition to mapping the effective columns to the low temperature wordlines 206. It is possible for the number of effective columns to exceed the number of low temperature wordlines 206. In that situation, in some circumstances, the temperature controller 320 utilizes a backup mode that performs matrix multiplication in a different manner. In an example, the temperature controller 320 causes a matrix multiplication array 200 having more effective columns than low temperature wordlines 206 to be executed with an error correcting code ("ECC"). Specifically, in this situation, the result of multiplication has lower accuracy due to mapping effective matrix portions to a high temperature wordline. In this case, strong ECC is embedded as a backup mode to avoid silent errors.

It is possible to perform multiplication of a matrix by a matrix. In that case, the first matrix is split up into a plurality of one-dimensional vectors and the technique described herein is repeated for each vector.

Figure 5:
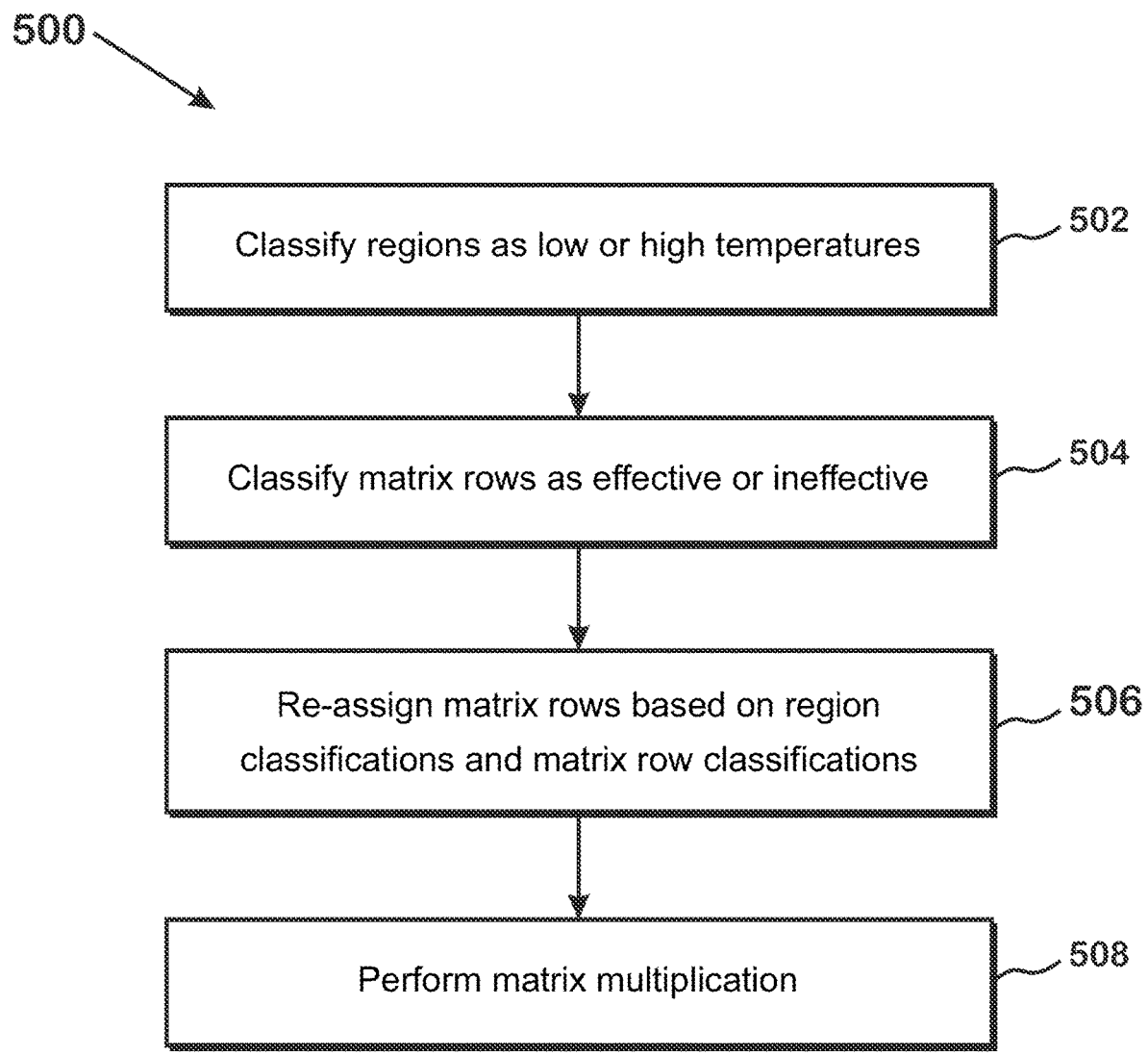
FIG. 5 is a flow diagram of a method for performing a matrix multiplication in an in-memory processor, taking into account temperature differences across the in-memory processor according to an example.

FIG. 5 is a flow diagram of a method 500 for performing a matrix multiplication in an in-memory processor, taking into account temperature differences across the in-memory processor according to an example.

The method 500 begins at step 502, where the temperature controller 320 classifies regions 302 as either high or low temperature. This classification is made based on measurements taken from temperature sensors 304, as described elsewhere herein (for example, in relation to FIG. 3).

To classify regions 302 as either high or low temperature, the temperature controller 320 determines whether the temperature determined for a region 302 is above a temperature threshold or below a temperature threshold. If the temperature is above the temperature threshold, then the temperature controller 320 classifies that region as a high temperature region. If the temperature is below a temperature threshold, then the temperature controller 320 classifies that region as a low temperature region. The temperature threshold may be set in any technically feasible manner. In one example, the temperature threshold is a constant such as 57 degrees Celsius (or can be a constant within 1 degree Celsius of 57 degrees Celsius).

At step 504, the temperature controller 320 classifies portions of an input matrix ("input matrix portions") for matrix multiplication as either effective or ineffective. This classification is made based on the magnitude of the elements of the input matrix portions, as described elsewhere herein.

At step 506, the temperature controller 320 swaps the input matrix portions that are classified as effective and are assigned to cells 208 of a matrix multiplication array 200 classified as high temperature in an initial configuration with input matrix portions that are classified as ineffective and are assigned to cells 208 of a matrix multiplication array 200 classified as low temperature in an initial configuration. An initial configuration is the arrangement of input matrix portions on the matrix multiplication array 200 without the swapping of the technique described herein. The temperature controller 320 may also cause the elements of the input vertex to be swapped in a corresponding manner, depending on the type of matrix multiplication being performed.

At step 508, the temperature controller 320 causes the matrix multiplication to be performed. In the implementation utilizing resistive RAM, the multiplication is performed by performing dot-products along the bitline 204, by applying the voltages of the input vector to the wordlines 206, which causes currents to flow from the wordlines 206 to the bitlines dependent on those voltages and the resistances of the resistive cells 208, and which currents are summed to be output along the bitlines 204. Although this technique is the one described elsewhere herein, any other technically feasible technique is possible.

It is possible for the temperature determination to occur less frequently than the frequency with which matrix multiplications are performed. According to such a scheme, the temperature controller 320 determines temperature for one or more regions 302 and that temperature is used in determining whether to swap columns for a certain period of time. After that period of time elapses, the temperature controller 320 again determines temperature for that region.

It should be understood that many variations are possible based on the disclosure herein. Although features and elements are described above in particular combinations, each feature or element can be used alone without the other features and elements or in various combinations with or without other features and elements.

The methods provided can be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors can be manufactured by configuring a manufacturing process using the results of processed hardware description language (HDL) instructions and other intermediary data including netlists (such instructions capable of being stored on a computer readable media). The results of such processing can be maskworks that are then used in a semiconductor manufacturing process to manufacture a processor which implements features of the disclosure.

The methods or flow charts provided herein can be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A method for performing an in-memory matrix multiplication, the method comprising:
    based on temperature measurements from left and right peripheral sensors in top and bottom regions of an in-memory processor, classifying regions of the in-memory processor as at least one low temperature region and at least one high temperature region;
    classifying a first matrix portion of a matrix as being effective and a second matrix portion of the matrix as being ineffective;
    assigning the first matrix portion to the low temperature region and assigning the second matrix portion to the high temperature region; and
    performing a matrix multiplication in the in-memory processor, with the matrix, to receive a product.

2. The method of claim 1, wherein classifying the regions of the in-memory processor comprises:
    determining a temperature for a subject region; and
    classifying the subject region as either a low temperature region or a high temperature region based on a comparison of the temperature with a temperature threshold.

3. The method of claim 2, wherein:
    the subject region comprises a peripheral region having a peripheral temperature sensor and a central temperature sensor; and
    determining the temperature for the subject region comprises determining the temperature as the highest temperature measured by the peripheral temperature sensor and the central temperature sensor.

4. The method of claim 3, wherein:
    the in-memory processor includes peripheral regions, each having a peripheral temperature sensor and a central temperature sensor;
    the in-memory processor includes non-peripheral regions, each including a central temperature sensor;

the subject region comprises one of the non-peripheral regions; and determining the temperature for the subject region comprises determining temperature based on temperatures measured for a peripheral region and for the subject region.

5. The method of claim 1, wherein classifying the first matrix portion as effective comprises:

determining that the number of non-zero elements of the first matrix portion is above a threshold.

6. The method of claim 1, wherein classifying the second matrix portion as ineffective comprises:

determining that the number of non-zero elements of the second matrix portion is below a threshold.

7. The method of claim 1, wherein assigning the first matrix portion to the low temperature region and assigning the second matrix portion to the high temperature region comprises swapping the first matrix portion and the second matrix portion.

8. The method of claim 1, wherein performing the matrix multiplication comprises:

applying a set of voltages corresponding to an input vector to a set of wordlines of the in-memory processor.

9. The method of claim 1, further comprising swapping elements of an input vector.

10. An in-memory matrix multiplication processing system comprising:

a temperature controller; and an in-memory processor, wherein the temperature controller is configured to:

based on temperature measurements from left and right peripheral sensors in top and bottom regions of the in-memory processor, classify regions of the in-memory processor as at least one low temperature region and at least one high temperature region, classify a first matrix portion of a matrix as being effective and a second matrix portion of the matrix as being ineffective, assign the first matrix portion to the low temperature region and assign the second matrix portion to the high temperature region, and perform a matrix multiplication in the in-memory processor, with the matrix, to receive a product.

11. The in-memory matrix multiplication processing system of claim 10, wherein classifying the regions of the in-memory processor comprises:

determining a temperature for a subject region; and classifying the subject region as either a low temperature region or a high temperature region based on a comparison of the temperature with a temperature threshold.

12. The in-memory matrix multiplication processing system of claim 11, wherein the subject region comprises a peripheral region having a peripheral temperature sensor and a central temperature sensor; and determining the temperature for the subject region comprises determining the temperature as the highest temperature measured by the peripheral temperature sensor and the central temperature sensor.

13. The in-memory matrix multiplication processing system of claim 12, wherein:

the in-memory processor includes peripheral regions, each having a peripheral temperature sensor and a central temperature sensor;

the in-memory processor includes non-peripheral regions, each including a central temperature sensor;

the subject region comprises one of the non-peripheral regions; and determining the temperature for the subject region comprises determining temperature based on temperatures measured for a peripheral region and for the subject region.

14. The in-memory matrix multiplication processing system of claim 10, wherein classifying the first matrix portion as effective comprises:

determining that the number of non-zero elements of the first matrix portion is above a threshold.

15. The in-memory matrix multiplication processing system of claim 10, wherein classifying the second matrix portion as ineffective comprises:

determining that the number of non-zero elements of the second matrix portion is below a threshold.

16. The in-memory matrix multiplication processing system of claim 10, wherein assigning the first matrix portion to the low temperature region and assigning the second matrix portion to the high temperature region comprises swapping the first matrix portion and the second matrix portion.

17. The in-memory matrix multiplication processing system of claim 10, wherein performing the matrix multiplication comprises:

applying a set of voltages corresponding to an input vector to a set of wordlines of the in-memory processor.

18. The in-memory matrix multiplication processing system of claim 10, wherein the temperature controller is further configured to swap element of an input vector.

19. A computing device comprising:

a processor; and an in-memory matrix multiplication processing system comprising:

a temperature controller; and an in-memory processor, wherein the temperature controller is configured to:

based on temperature measurements from left and right peripheral sensors in top and bottom regions of the in-memory processor, classify regions of the in-memory processor as at least one low temperature region and at least one high temperature region, classify a first matrix portion of a matrix as being effective and a second matrix portion of the matrix as being ineffective, assign the first matrix portion to the low temperature region and assign the second matrix portion to the high temperature region, and perform a matrix multiplication in the in-memory processor, with the matrix, to receive a product.

20. The computing device of claim 19, wherein classifying the regions of the in-memory processor comprises:

determining a temperature for a subject region; and classifying the subject region as either a low temperature region or a high temperature region based on a comparison of the temperature with a temperature threshold.

* * * * *